(12) United States Patent
Wang et al.

(10) Patent No.: US 12,140,997 B2
(45) Date of Patent: Nov. 12, 2024

(54) SUPPORT STRUCTURE MEMBER AND DISPLAY DEVICE

(71) Applicant: Hefei Visionox Technology Co., Ltd., Anhui (CN)

(72) Inventors: Yaling Wang, Hefei (CN); Leichao Zhang, Hefei (CN); Fang Zhang, Hefei (CN); Zhengyang Li, Hefei (CN)

(73) Assignee: HEFEI VISIONOX TECHNOLOGY CO., LTD., Hefei (CN)

( * ) Notice: Subject to any disclaimer, the term of this patent is extended or adjusted under 35 U.S.C. 154(b) by 290 days.

(21) Appl. No.: 17/832,958

(22) Filed: Jun. 6, 2022

(65) Prior Publication Data

US 2022/0300038 A1 Sep. 22, 2022

Related U.S. Application Data

(63) Continuation of application No. PCT/CN2021/090557, filed on Apr. 28, 2021.

(30) Foreign Application Priority Data

Jun. 29, 2020 (CN) .......................... 202010602526.2

(51) Int. Cl.
*G06F 1/16* (2006.01)
*H05K 5/02* (2006.01)

(52) U.S. Cl.
CPC .......... *G06F 1/1641* (2013.01); *G06F 1/1681* (2013.01); *H05K 5/0226* (2013.01); *G06F 2200/1613* (2013.01)

(58) Field of Classification Search
None
See application file for complete search history.

(56) References Cited

U.S. PATENT DOCUMENTS

| 9,733,668 | B2 * | 8/2017 | Park | G04G 17/08 |
| 10,117,346 | B2 * | 10/2018 | Yang | G06F 1/1652 |

(Continued)

FOREIGN PATENT DOCUMENTS

| CN | 104898784 A | 9/2015 |
| CN | 205978043 U | 2/2017 |

(Continued)

OTHER PUBLICATIONS

International Search Report (with English Translation) issued on Jul. 15, 2021 in corresponding International Patent Application No. PCT/CN2021/090557; 13 pages.

(Continued)

*Primary Examiner* — Anthony Q Edwards
*Assistant Examiner* — Rashen E Morrison
(74) *Attorney, Agent, or Firm* — Maier & Maier, PLLC

(57) ABSTRACT

A support structure member and a display device. The support structure member includes a first support assembly, including a plurality of support members arranged in a first direction, in which the plurality of support members can be slidably arranged relative to one another in the first direction, and a gap is formed between two adjacent support members, and the first support assembly is bent by each position of the gap; a second support assembly, movably arranged relative to the first support assembly at least one side of the support members in a thickness direction, in which the second support assembly includes a connecting unit and a hinge unit connected to the connecting unit, the second support assembly moves to the gap of the first support assembly, and in the gap, the hinge unit and the support members together support a to-be-supported member.

17 Claims, 6 Drawing Sheets

(56) References Cited

U.S. PATENT DOCUMENTS

| | | | |
|---|---|---|---|
| 10,520,992 B1 * | 12/2019 | Chang | H05K 5/0226 |
| 11,023,009 B2 * | 6/2021 | Kim | G06F 1/1681 |
| 11,406,026 B2 * | 8/2022 | Van Dijk | H05K 5/0017 |
| 11,490,532 B2 * | 11/2022 | Chen | E05D 11/105 |
| 11,723,170 B2 * | 8/2023 | Ohyama | G06F 1/1626 |
| | | | 361/679.27 |
| 2013/0342094 A1 | 12/2013 | Walters et al. | |
| 2015/0366089 A1 * | 12/2015 | Park | H04M 1/0268 |
| | | | 361/679.01 |
| 2018/0275725 A1 * | 9/2018 | Lin | H04M 1/0268 |
| 2019/0174645 A1 | 6/2019 | Jeon et al. | |

FOREIGN PATENT DOCUMENTS

| | | | | |
|---|---|---|---|---|
| CN | 207781086 U | | 8/2018 | |
| CN | 108665809 A | | 10/2018 | |
| CN | 207977991 U | | 10/2018 | |
| CN | 109257460 A | * | 1/2019 | G06F 1/1616 |
| CN | 110035140 A | | 7/2019 | |
| CN | 110969938 A | * | 4/2020 | G09F 9/301 |
| CN | 111128016 A | | 5/2020 | |
| CN | 111765162 A | | 10/2020 | |
| CN | 111128016 B | * | 10/2021 | G09F 9/301 |
| KR | 20180131143 A | | 12/2018 | |
| TW | 201921220 A | | 6/2019 | |

OTHER PUBLICATIONS

Office Action issued on Mar. 22, 2021 in connection with corresponding Chinese Patent Application No. 202010602526.2 (15 pp., including machine-generated English translation).

* cited by examiner

SUPPORT STRUCTURE MEMBER AND DISPLAY DEVICE

CROSS REFERENCE TO RELATED APPLICATION

The present application is a continuation of International Application No. PCT/CN2021/090557, filed on Apr. 28, 2021, which claims priority to Chinese Patent Application No. 202010602526.2, filed on Jun. 29, 2020, titled with "SUPPORT STRUCTURE MEMBER AND DISPLAY DEVICE", both of which are hereby incorporated by reference in their entireties.

FIELD

The present application relates to the technical field of electronic products, and in particular relates to a support structure member and a display device.

BACKGROUND

With the development of flexible display technology, flexible screens are increasingly used in terminal devices. In a terminal device, a flexible screen and a flexible screen support structure are usually combined, and the flexible screen can be folded and unfolded by using the flexible screen support structure to form a folding screen in the terminal device. Compared with traditional screens, the flexible screen has advantages, such as lightness and thinness, low power consumption, and because the flexible screen is bendable and flexible, the application scenarios of the flexible screen are becoming more and more extensive. However, in a prior art, a bendable position of the flexible screen is fixed and cannot be changed, so that the flexible screen cannot be folded at different positions.

Therefore, there is an urgent requirement for a new support structure member and a display device.

SUMMARY

Embodiments of the present application provide a support structure member and a display device. By adjusting a position of a gap of a first support member, a bending position of the support structure member can be adjusted, thereby changing the bending position of a to-be-supported member and realizing the adjustability of the bending position of the to-be-supported member.

In a first aspect, the embodiments of the present application provides the support structure member, including a plurality of support members arranged in a first direction, in which the plurality of support members is slidably arranged relative to one another in the first direction, and a gap is formed between two adjacent support members, and the first support assembly is enabled to be bent at each position of the gap; a second support assembly is movably arranged relative to the first support assembly at at least one side of the support members in a thickness direction, the second support assembly includes at least one connecting unit and at least one hinge unit connected to the connecting unit, the second support assembly moves to the gap of the first support assembly to support a to-be-supported member by the hinge unit and the support members.

In another aspect, the embodiments of the present application provide a display device, including any support structure member as described above, and the to-be-supported member, the to-be-supported member is arranged on a surface at a side of the first support assembly of the support structure member away from the at least one connecting unit.

The support structure member provided by the embodiments of the present application includes the first support assembly and the second support assembly. The plurality of support members can be slidably arranged relative to one another in the first direction, the gap can be formed between two adjacent support members, and the first support assembly is bent by each position of the gap; the second support assembly is movably arranged relative to the first support assembly at at least one side of the support members in the thickness direction, the second support assembly includes the at least one connecting unit and the at least one hinge unit connected to the connecting unit. The second support assembly moves to the gap of the first support assembly to support a to-be-supported member by the hinge unit and the support members, so as to avoid bending or wrinkling at a part of the to-be-supported member corresponding to the position of the gap. Since the first support assembly realizes the bending of the support structure member and the to-be-supported member through the position of the gap, the position of the gap can be adjusted by sliding the support members, which means the bending position of the support structure can be adjusted, thereby changing the bending position of the to-be-supported member, and realizing the adjustability of the bending position of the to-be-supported member.

DETAILED DESCRIPTION

Features and exemplary embodiments of various aspects of the present application are described in detail below. In the following detailed description, numerous specific details are set forth in order to provide a thorough understanding of the present application. However, it will be apparent to those skilled in the art that the present application may be practiced without some of these specific details. The following description of the embodiments is merely to provide a better understanding of the present application by illustrating examples of the present application.

For a better understanding of the present application, a support structure member and a display device according to embodiments of the present application will be described in detail below with reference to FIGS. 1 to 13.

Figure 1:
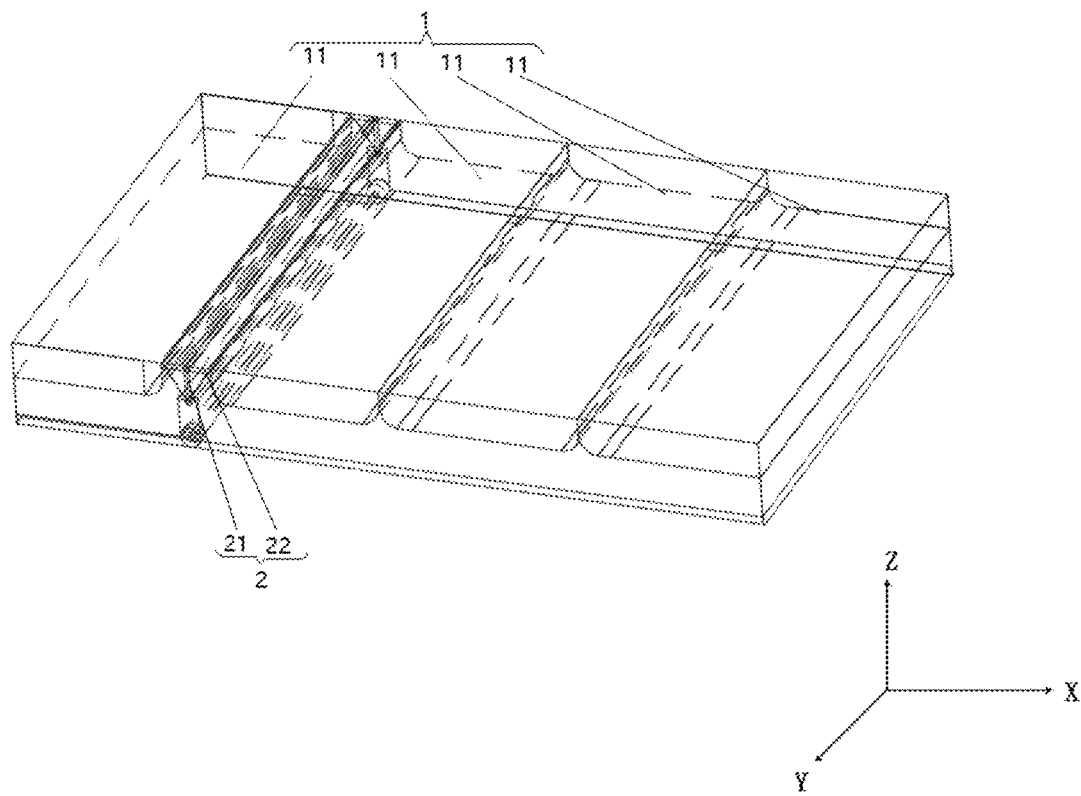
FIG. 1 shows a schematic structural view of a support structure member in a state according to an embodiment of the present application.

As shown in FIG. 1, the embodiments of the present application provides the support structure member including a first support assembly 1 and a second support assembly 2. The first support assembly 1 includes a plurality of support members 11 arranged in a first direction X, the plurality of support members 11 is slidably arranged relative to one another in the first direction to form a gap between two adjacent support members 11. The first support assembly 1 can be bent at the gap, and at least one side of the support members 11 can be movably arranged relative to the first support assembly 1 at in a thickness direction of the support members 11. The second support assembly includes at least one connecting unit 21 and at least one hinge unit 22 connected to the at least one connecting unit 21, and the second support assembly 2 moves to the gap of the first support assembly 1 to support a to-be-supported member 4 together with the support members 11, so as to reduce or even avoid bending or wrinkling at a part of the to-be-supported member 4 corresponding to the gap.

Since the support structure member and the to-be-supported member 4 is bent via the gap between the support members 11, the position of the gap can be adjusted by sliding the support members 11, that is, the bending position of the support structure can be adjusted, thereby changing the bending position of the to-be-supported member 4, and realizing the adjustability of the bending position of the to-be-supported member 4.

It should be noted that the number and the dimensions such as length, width and so on of the support members 11 need to be set according to a length and a width of the to-be-supported member 4. In addition, surfaces of the support members 11 facing to the to-be-supported member 4 are arranged to be coplanar, so that the support members 11 can have a sufficient contact area with the to-be-supported member 4, and can support the to-be-supported member 4 in a flat state together with the second support assembly 2. Optionally, the to-be-supported member 4 is a flexible display panel, which can be bent together with the first support assembly 1 at the position of the gap.

It can be understood that, at least one side of the second support assembly 2 in the thickness direction of the support members 11 can be movably arranged relative to the first support assembly 1, so that the at least one hinge unit 22 of the second support assembly 2 can move to a position corresponding to the gap of the first support assembly 1 to support the to-be-supported member 4, thereby ensuring that the to-be-supported member 4 can be effectively supported at each position and improving the flatness of the to-be-supported member 4, and preventing the to-be-supported member 4 from sinking and bending due to the unsupported part thereof to enhance the service life of the to-be-supported member 4.

In some optional embodiments, the at least one connecting unit 21 of the second support assembly 2 extends along a second direction Y, the at least one hinge unit 22 is arranged in the second direction Y, and the second direction Y is an extending direction of the gap and intersects with the first direction X; or the at least one connecting unit 21 includes a plurality of connecting units 21, the at least one hinge unit 22 includes a plurality of hinge units 22, the connecting units 21 and the hinge units 22 are connected in one-to-one correspondence to form a plurality of groups, and the groups are arranged apart from one another in the second direction.

Figure 2:
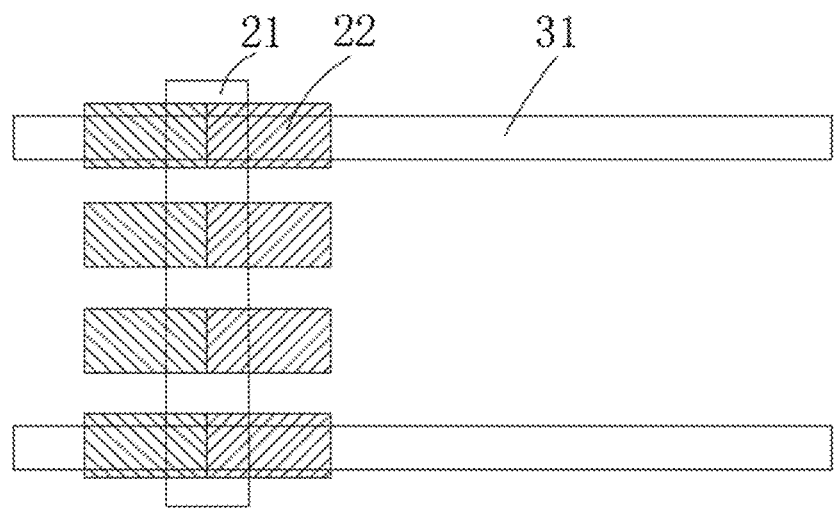
FIG. 2 shows a plan view of a second support assembly according to an embodiment of the present application.
Figure 3:
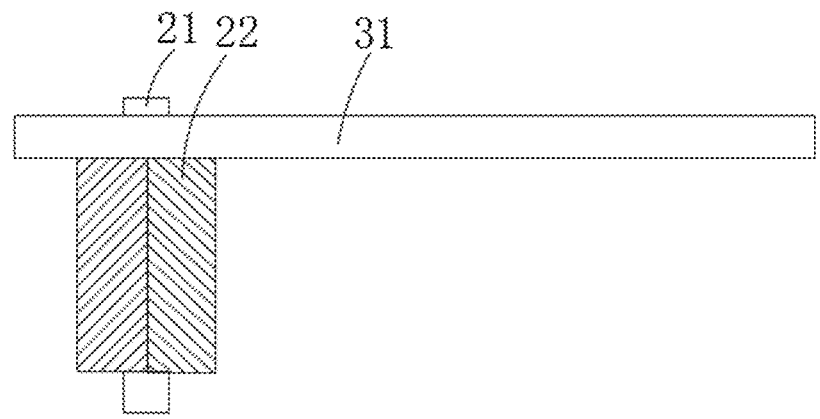
FIG. 3 shows a plan view of another second support assembly according to an embodiment of the present application.

It should be noted that at least one hinge unit 22 is arranged in the second direction Y, specifically, there may be only one hinge unit 22 arranged to be connected with the connecting unit 21. Optionally, a length of the hinge unit 22 is equal to an extension length of the connecting unit 21 in the second direction Y. As shown in FIG. 2 and FIG. 3, there may be only one hinge unit 22 arranged on one connecting unit 21, which is suitable for a narrow screen; there may be a plurality of hinge units 22 arranged on one connecting unit 21, and the hinge units 22 can be arranged apart from one another in the second direction Y.

Figure 4:
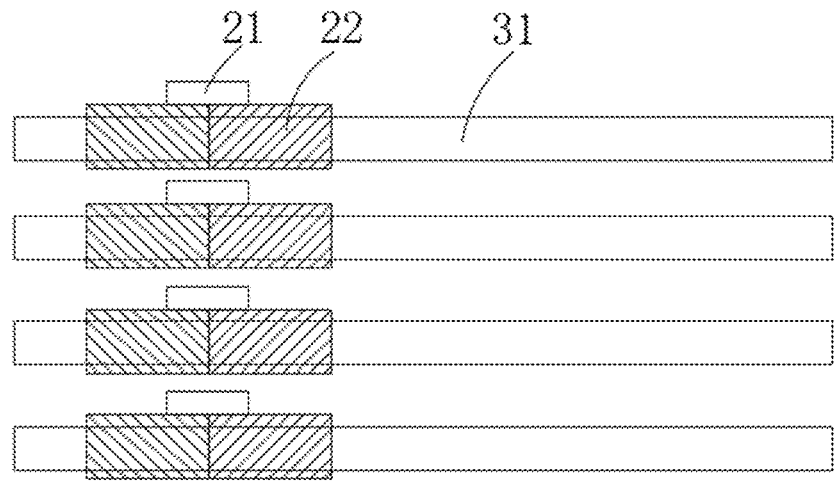
FIG. 4 shows a plan view of another second support assembly according to an embodiment of the present application.

Referring to FIG. 4, in another embodiment, in the second support assembly 2, the connecting units 21 and the hinge units 22 are connected in one-to-one correspondence to form a plurality of groups, and the groups are arranged apart from one another in the second direction, that is, each of the groups includes one connecting unit 21 and one hinge unit 22, and the groups are arranged in the second direction Y, so that it has higher flexibility and facilitates individual replacement or maintenance of the connecting unit 21 and hinge unit 22 in each of the groups.

Figure 5:
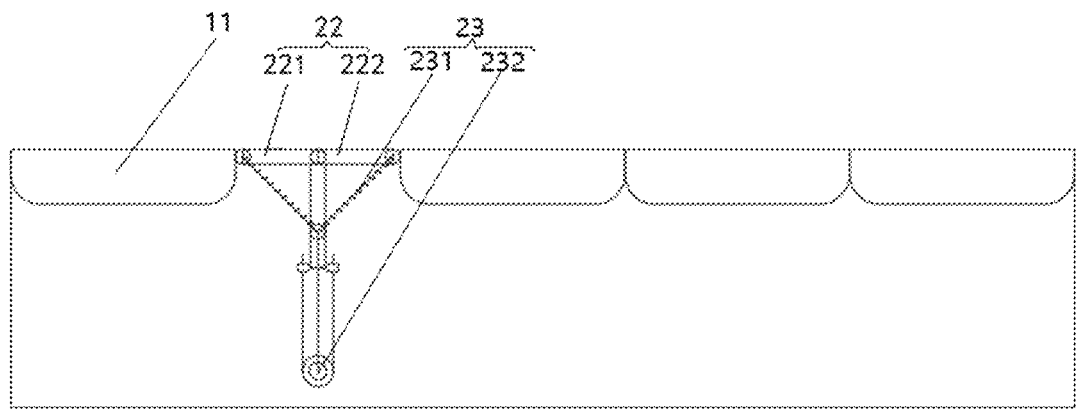
FIG. 5 shows a front view of a support structure member in a state according to an embodiment of the present application.

Referring to FIG. 5, in some embodiments, the hinge unit 22 includes a first plate member 221 and a second plate member 222 hinged with the connecting unit 21, and the second support assembly 2 further includes a driving assembly 23 to drive the first plate member 221 and the second plate member 222 to rotate relative to the connecting unit 21.

Specifically, the first plate member 221 and the second plate member 222 are symmetrically arranged with respect to the connecting unit 21 and a hinge point of the connecting unit 21, that is, the first plate member 221 and the second plate member 222 will rotate in opposite directions when unfolding and retracting. Optionally, the first plate member 221 and the second plate member 222 are same rectangular plate members. The rectangular plate member has a flat surface and can effectively support the to-be-supported member 4. In order to retract the first plate member 221 and the second plate member 222 to prevent the first plate member 221 and the second plate member 222 from interfering with the first support assembly 1 and affecting the first support assembly 1 to bend the to-be-supported member 4, the second support assembly 2 further includes a driving assembly 23. The first plate member 221 and the second plate member 222 are driven to rotate relative to the connecting unit 21 by the driving assembly 23, so as to realize the unfolding and retracting of the first plate member 221 and the second plate member 222.

On the basis of the embodiments described above, the driving assembly 23 includes elastic members 231 and a power element 232, the first plate member 221 and the second plate member 222 are connected to the power element 232 via the elastic members 231 respectively to drive the first plate member 221 and the second plate member 222 to rotate relative to the connecting unit 21.

Figure 10:
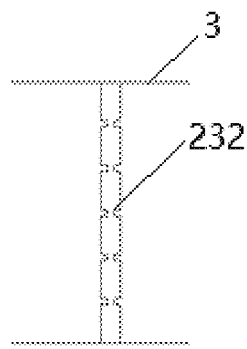
FIG. 10 shows a schematic structural view of a power element according to an embodiment of the present application.

It should be noted that, two ends of the first plate member 221 and the second plate member 222 away from the hinge point of the connecting unit 21 are connected with the elastic members 231 respectively. The other ends of the elastic members 231 are connected with the power element 232 directly or via a connecting wire. Optionally, as shown in FIG. 10, the power element 232 is a rotating shaft, the rotating shaft is arranged at an end of the connecting unit 21 away from the first plate member 221 and the second plate member 222, and the connecting wire is arranged between the elastic members 231 and the rotating shaft. When the rotating shaft rotates, the connecting wire can be wound on the rotating shaft and shortens to move the elastic members 231 close to the rotating shaft, so that the elastic members 231 pull the first plate member 221 and the second plate member 222 to rotate close to the rotating shaft to complete the retraction. In a retracted state, extending directions of the first plate member 221 and the second plate member 222 are parallel to an axial extending direction of the connecting unit 21, and in an unfolded state, the extending directions of the first plate member 221 and the second plate member 222 are perpendicular to the axis extending direction of the connecting unit 21. There may be only one power element 232 arranged to control the hinge units 22 at the same time, so as to improve the synchronization of rotation of the hinge units 22. Specifically, each of the elastic members 231 may be a compression spring, a Z-shaped elastic piece or the like.

In order to reduce the space occupied by the second support assembly 2 when the support structure member is bent, in some optional embodiments, each of the at least one connecting unit 21 includes a first cylindrical body 211 and a second cylindrical body 212 enclosing the first cylindrical body, the second cylindrical body 212 includes a space for accommodating the first cylindrical body 211, an elastic retractable member that is retractable by force is arranged in the space, when the first cylindrical body 211 protrudes from the second cylindrical body 212 to resist against the elastic retractable member, the hinge unit 22 is connected to the first cylindrical body 211, and the power element 232 is arranged at the second cylindrical body 212. After the first cylindrical body 211 is retracted into the second cylindrical body 212, the hinge unit 22 is located at a side of the support members 11 away from the to-be-supported member 4.

Figure 6:
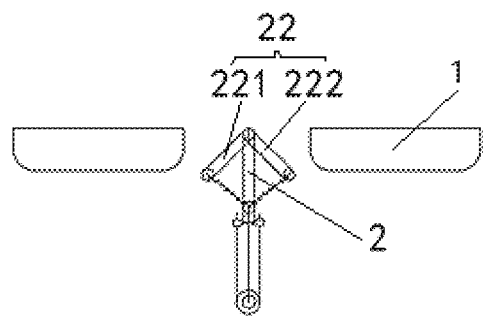
FIG. 6 shows a front view of another support structure member in a state according to an embodiment of the present application.

Referring to FIGS. 5 to 8, the plurality of hinge units 22 are rotated by the same power element 232. As shown in FIG. 6, when the power element 232 rotates clockwise, the elastic members 231 respectively connected to the first plate member 221 and the second plate member 222 on the top of the connecting unit 21 will be moved and retracted in a direction of the power element 232. Under the action of pulling force, the first plate member 221 and the second plate member 222 are restored from an unfolded and flattened state to the retracted state. It should be noted that since the elastic members 231 need to support the first plate member 221 and the second plate member 222 to keep still in the unfolded and flattened state, the elastic members 231 are in a compressed state, and the unfolded and flattened state of the first plate member 221 and the second plate member 222 can be maintained under the action of the elastic restoring force generated by the elastic members 231.

It should be noted that after the first cylindrical body 211 is retracted into the second cylindrical body 212, the hinge unit 22 is located at the side of the support members 11 away from the to-be-supported member 4. It can be understood that when the support structure member supports the to-be-supported member 4, the support members 11 have support faces to support the to-be-supported member 4; after the first cylindrical body 211 is retracted and received in the second cylindrical body 212, the hinge unit 22 is integrally located at the side of the support members 11 away from the support faces. It can also be understood that, in a third direction Z, after the first cylindrical body 211 is retracted and received in the second cylindrical body 212, a highest point of the connecting unit 21 is lower than a lowest point of the support members 11. Herein, the third direction Z is parallel to the thickness direction of the support members 11. After the first cylindrical body 211 is retracted into the second cylindrical body 212, the highest point of the hinge unit 22 is lower than the lowest point of the support members 11 to avoid the hinge unit 22 from interfering with the support member 11 when the hinge unit 22 needs to move to another bending position.

Figure 7:
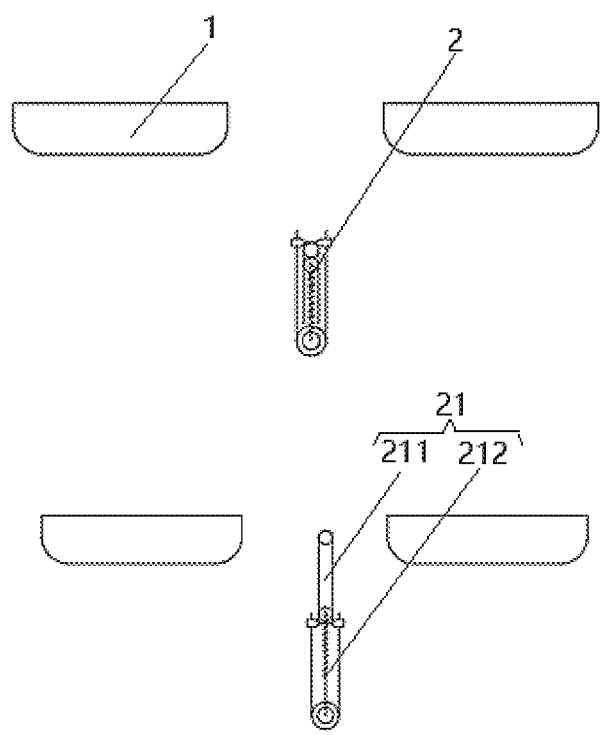
FIG. 7 shows a front view of another support structure member in a state according to an embodiment of the present application.
Figure 8:
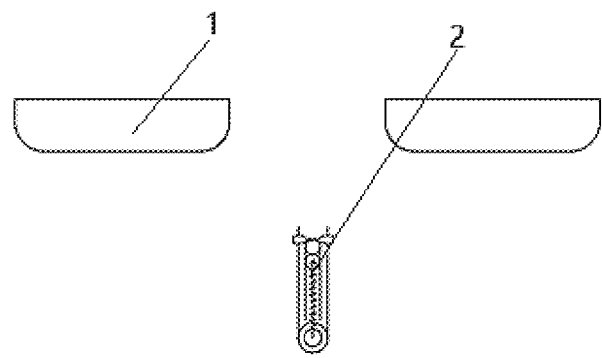
FIG. 8 shows a front view of another support structure member in a state according to an embodiment of the present application.

As shown in FIG. 6 to FIG. 7, the connecting unit 21 includes the first cylindrical body 211 and the second cylindrical body 212 enclosing the first cylindrical body, diameters of shafts of the first cylindrical body 211 and the second cylindrical body 212 are different, the elastic retractable member similar to a lock cylinder design is arranged at a connecting place between the first cylindrical body 211 and the second cylindrical body 212, and when the first cylindrical body 211 extends out of the second cylindrical body 212, it is clamped and held at the elastic telescopic element. When the elastic retractable member is acted by a predetermined external force, the elastic retractable member retracts without affecting the first cylindrical body 211 falling back into the space of the second cylindrical body 212, and the retraction of the hinge unit 22 is completed at this time. When the hinge unit 22 is to be unfolded, the power element 232 rotates counterclockwise. With the help of the elastic restoring force of the elastic members 231, the first cylindrical body 211 protrudes from the space of the second cylindrical body 212. The elastic retractable member retracts under the predetermined force of the first cylindrical body 211, the first cylindrical body 211 returns to the top, and the elastic restoring force of the elastic members 231 acts on the first plate member 221 and the second plate member 222 to make them gradually rotate and unfold.

Figure 11:
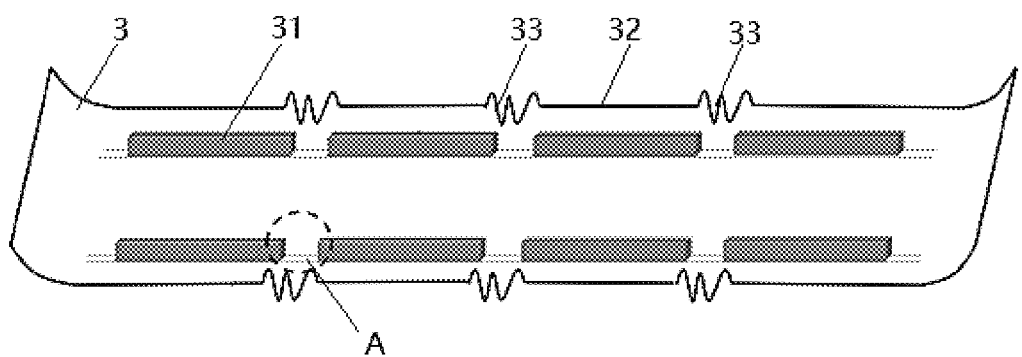
FIG. 11 shows a schematic structural view of a housing according to an embodiment of the present application.

Referring to FIG. 11, in order to fix the first support assembly 1 and the second support assembly 2, in some embodiments, the support structure member further includes a housing 3. The first support assembly 1 is connected to the housing 3, and the second support assembly 2 is slidably connected to the housing 3 and is arranged between the first support assembly 1 and the housing 3.

Specifically, a common material of the housing 3 may select a metal shell or a plastic shell, and the housing 3 is made of a material with high elasticity and resistance to falling, so that it is beneficial to the folding of the flexible display panel. The first support assembly 1 is connected to the housing 3, and the movement of the support plate of the first support assembly 1 is restricted by the housing 3. Specifically, the movement can be restricted by arranging a block, a rail and other structure. The second support assembly 2 can be slidably connected to the housing 3 and is arranged between the first support assembly 1 and the housing 3. The second support assembly 2 can move with the position of the gap when the position of the gap of the first support assembly 1 is changed, so as to support the to-be-supported member 4 at the gap.

In some embodiments, as shown in FIG. 5, outer edges of surfaces of the support members 11 facing to the housing 3 in the first direction form a smooth curved face.

It should be noted that the formation of the gap of the first support assembly 1, that is, the movement of each support plate, can be directly controlled by a component such as a motor, or can be performed by moving the second support assembly 2 toward the direction of the first support assembly 1 to push up two adjacent support members 11 to form a gap. In order to facilitate the support members 11 to be pushed out and slide, the outer edges of the surfaces of the support members 11 facing to the housing 3 in the first direction X form the smooth curved face. The edges of the adjacent support members 11 are all designed with rounded corners. When the second support assembly 2 moves upward, the first plate member 221 and the second plate member 222 are gradually unfolded and flattened under the action of the elastic restoring force generated by the elastic members 231 to drive the support members 11 to slide so as to create the gap between two corresponding support members 11. Since the support members 11 are slidably arranged with one another, the force driving the support members 11 to slide does not need to be large. Therefore, the support members 11 can be pushed to slide by the elastic restoring force generated when the elastic members 231 are compressed.

Figure 9:
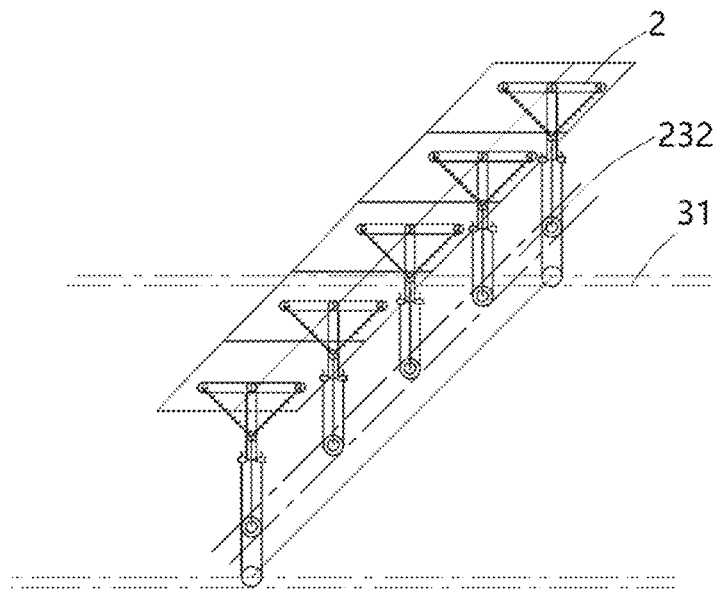
FIG. 9 shows a schematic structural view of a second support assembly according to an embodiment of the present application.

Referring to FIG. 9, in order to restrict a movement path of the second support assembly 2, in some embodiments, the support structure member further includes a power portion connected to the at least one connecting unit 21 of the second support assembly 2, at least one track groove 31 extending along the first direction is formed on the housing 3, a width of the track groove 31 is greater than or equal to a diameter of each of the at least one connecting unit 21, and the power portion is arranged at two ends of the housing 3 away from the track groove 31 to provide a driving force for the second support assembly 2.

It should be noted that the track groove 31 can be arranged according to the number of the connecting units 21, can be in one-to-one correspondence with the connecting units 21, or can be arranged only in correspondence with the connecting units 21 located at outermost sides, which can save costs. Optionally, an end of the connecting unit 21 connected to the track groove 31 is in a shape of semicircle. At the same time, the track groove 31 can be continuously arranged, the power portion drives the second support assembly 2 to move along the track groove 31 completely, and the track groove 31 can also be discontinuously arranged, a discontinuous position can be arranged corresponding to a position where the gap can be formed between the support plates 11, that is, the discontinuous position can be arranged corresponding to a bendable position of the support structure member, so that the second support assembly 2 supports the to-be-supported member 4, the power portion can drive the second support assembly 2 to move along the track groove 31 and can drive the second support assembly 2 to move along the track groove 31, so as to cross a discontinuity between two sections of the track grooves 31 and enter another section of the track grooves 31 to move.

Figure 12:
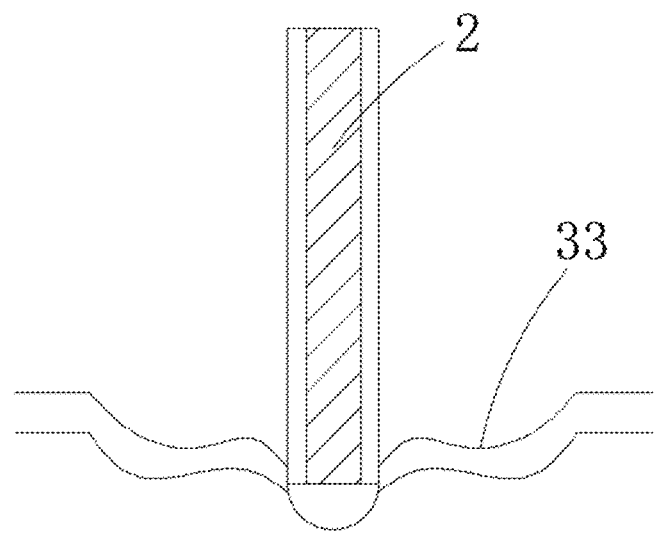
FIG. 12 shows a partial enlarged view at A portion in FIG. 11.
Figure 13:
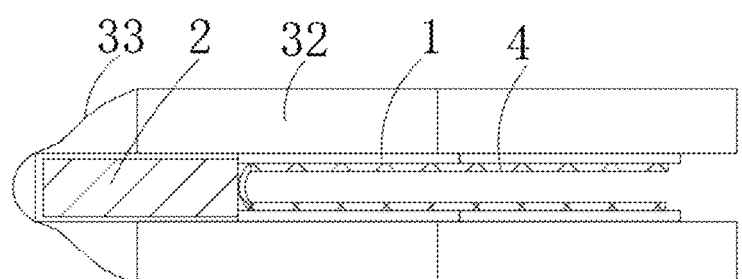
FIG. 13 shows a schematic structural view of a support structure member in another state according to an embodiment of the present application.

Please refer to FIG. 11 to FIG. 13, in some embodiments, the housing 3 includes a flat plate portion 32 and an elastic bending portion 33, the flat plate portion 32 is arranged facing to the first support assembly 1, and the elastic bending portion 33 is arranged facing to the second support assembly 2.

It can be understood that the second support assembly 2 is located at the bendable position of the support structure member, thus, a position of the elastic bending portion 33 also corresponds to the bendable position of the support structure member, which is convenient for bending. The elastic bending portion 33 can be an elastic structure similar to an accordion for correspondingly connecting a bending part, and can also form a closed structure for dust prevention.

The present application further provides a display device including the support structure member as described above and the to-be-supported member 4, the to-be-supported member is a flexible display panel, and the first support assembly 1 and the second support assembly 2 are located at a same side of the to-be-supported member 4, so as to support the to-be-supported member 4 together.

The above are only specific embodiments of the present application. Those skilled in the art should clearly understand that, for the convenience and brevity of description, for the specific working process of the above-described systems, modules and units, reference may be made to the corresponding processes in the foregoing method embodiments, which will not be repeated here. It should be understood that the protection scope of the present application is not limited to this. Any person skilled in the art can easily think of various equivalent modifications or replacements within the technical scope disclosed in the present application, and these modifications or replacements should all cover within the scope of protection of the present application.

It should also be noted that the exemplary embodiments mentioned in the present application describe some methods or systems based on a series of steps or devices. However, the present application is not limited to the order of the above steps, that is, the steps may be performed in the order mentioned in the embodiments, or may be different from the order in the embodiments, or several steps may be performed simultaneously.

What is claimed is:

1. A support structure member, comprising
a first support assembly, comprising a plurality of support members arranged in a first direction, wherein the plurality of support members are slidable relative to one another in the first direction, a gap is formed between two adjacent support members to bend the first support assembly at the gap;
a second support assembly, wherein at least one side of the second support assembly is movably arranged relative to the first support assembly in a thickness direction of the support members, the second support assembly comprises at least one connecting unit and at least one hinge unit connected to the connecting unit, the second support assembly moves to the gap of the first support assembly to support a to-be-supported member by the hinge unit and the support members,
wherein the at least one connecting unit comprises a plurality of connecting units, the at least one hinge unit comprises a plurality of hinge units, the connecting units and the hinge units are connected in one-to-one correspondence to form a plurality of groups, and the groups are arranged apart from one another in a second direction.

2. The support structure member according to claim 1, wherein each of the least one connecting unit of the second support assembly extends along a second direction, the at least one hinge unit is arranged in the second direction, and the second direction is a direction which the gap extending along and intersects with the first direction.

3. The support structure member according to claim 2, wherein a length of each of the at least one hinge unit is equal to an extension length of each of at least one the connecting unit in the second direction.

4. The support structure member according to claim 1, wherein each of the at least one hinge unit comprises a first plate member and a second plate member hinged with the connecting unit, and the second support assembly further comprises a driving assembly to drive the first plate member and the second plate member to rotate relative to the at least one connecting unit.

5. The support structure member according to claim 4, wherein the driving assembly comprises a plurality of elastic members and a power element, the first plate member and the second plate member are connected to the power element via the elastic members respectively to drive the first plate member and the second plate member to rotate relative to the connecting unit.

6. The support structure member according to claim 5, wherein the power element is a rotating shaft, the rotating shaft is arranged at an end of the connecting unit away from the first plate member and the second plate member, and a connecting wire is arranged between the elastic members and the rotating shaft.

7. The support structure member according to claim 6, wherein the connecting unit comprises a first cylindrical body and a second cylindrical body enclosing the first cylindrical body, the second cylindrical body comprises a space for accommodating the first cylindrical body, an elastic retractable member is arranged in the space, when the first cylindrical body extends from the second cylindrical body to resist against the elastic retractable member, the at least one hinge unit is connected to the first cylindrical body, and the rotating shaft is arranged in the second cylindrical body;
   after the first cylindrical body is retracted into the second cylindrical body, the hinge unit is located at a side of the support members away from the to-be-supported member.

8. The support structure member according to claim 1, further comprising a housing, wherein the first support assembly is connected to the housing, and the second support assembly is slidably connected to the housing and is arranged between the first support assembly and the housing.

9. The support structure member according to claim 8, wherein outer edges of surfaces of the support members facing to the housing in the first direction is a smooth curved face.

10. The support structure member according to claim 8, further comprising a power portion connected to the connecting unit of the second support assembly, wherein at least one track groove extending along the first direction is formed on the housing, a width of the track groove is greater than or equal to a size of the at least one connecting unit in a second direction, and the power portion is arranged at two ends of the housing away from the track groove to provide a driving force for the second support assembly.

11. The support structure member according to claim 10, wherein an end of each of the at least one connecting unit connected to the track groove is in a shape of semicircle.

12. The support structure member according to claim 10, wherein the housing comprises a flat plate portion corresponding to the first support assembly and an elastic bending portion corresponding to the second support assembly.

13. A display device, comprising the support structure member according to claim 1, and the to-be-supported member, wherein the to-be-supported member is a flexible display panel, and the first support assembly and the second support assembly are located at a same side of the to-be-supported member.

14. A support structure member, comprising:
a first support assembly, comprising a plurality of support members arranged in a first direction, wherein the plurality of support members are slidable relative to one another in the first direction, a gap is formed between two adjacent support members to bend the first support assembly at the gap; and
a second support assembly, wherein at least one side of the second support assembly is movably arranged relative to the first support assembly in a thickness direction of the support members, the second support assembly comprises at least one connecting unit and at least one hinge unit connected to the connecting unit, the second support assembly moves to the gap of the first support assembly to support a to-be-supported member by the hinge unit and the support members,
wherein each of the at least one hinge unit comprises a first plate member and a second plate member hinged with the connecting unit, and the second support assembly further comprises a driving assembly to drive the first plate member and the second plate member to rotate relative to the at least one connecting unit, and
wherein the driving assembly comprises a plurality of elastic members and a power element, the first plate member and the second plate member are connected to the power element via the elastic members respectively to drive the first plate member and the second plate member to rotate relative to the connecting unit.

15. The support structure member according to claim 14, wherein the power element is a rotating shaft, the rotating shaft is arranged at an end of the connecting unit away from the first plate member and the second plate member, and a connecting wire is arranged between the elastic members and the rotating shaft.

16. The support structure member according to claim 15, wherein the connecting unit comprises a first cylindrical body and a second cylindrical body enclosing the first cylindrical body, the second cylindrical body comprises a space for accommodating the first cylindrical body, an elastic retractable member is arranged in the space, when the first cylindrical body extends from the second cylindrical body to resist against the elastic retractable member, the at least one hinge unit is connected to the first cylindrical body, and the rotating shaft is arranged in the second cylindrical body; and
   wherein after the first cylindrical body is retracted into the second cylindrical body, the hinge unit is located at a side of the support members away from the to-be-supported member.

17. A support structure member, comprising:
a first support assembly, comprising a plurality of support members arranged in a first direction, wherein the plurality of support members are slidable relative to one another in the first direction, a gap is formed between two adjacent support members to bend the first support assembly at the gap; and
a second support assembly, wherein at least one side of the second support assembly is movably arranged relative to the first support assembly in a thickness direction of the support members, the second support assembly comprises at least one connecting unit and at least one hinge unit connected to the connecting unit, the second support assembly moves to the gap of the first support assembly to support a to-be-supported member by the hinge unit and the support members,
wherein each of the least one connecting unit of the second support assembly extends along a second direction, the at least one hinge unit is arranged in the second direction, and the second direction is a direction which the gap extending along and intersects with the first direction, and wherein a length of each of the at least one hinge unit is equal to an extension length of each of at least one the connecting unit in the second direction.

* * * * *